United States Patent
Schulz-Harder et al.

(10) Patent No.: US 8,749,052 B2
(45) Date of Patent: Jun. 10, 2014

(54) ELECTRONIC DEVICE

(75) Inventors: Jürgen Schulz-Harder, Lauf (DE); Andreas Meyer, Wenzenback (DE)

(73) Assignee: Curamik Electronics GmbH, Eschenbach (DE)

( * ) Notice: Subject to any disclaimer, the term of this patent is extended or adjusted under 35 U.S.C. 154(b) by 396 days.

(21) Appl. No.: 13/381,518

(22) PCT Filed: Jun. 29, 2010

(86) PCT No.: PCT/DE2010/000745
§ 371 (c)(1),
(2), (4) Date: Feb. 8, 2012

(87) PCT Pub. No.: WO2011/000360
PCT Pub. Date: Jan. 6, 2011

(65) Prior Publication Data
US 2012/0134115 A1   May 31, 2012

(30) Foreign Application Priority Data
Jul. 2, 2009  (DE) .................. 10 2009 033 029

(51) Int. Cl.
*H01L 23/10* (2006.01)
*H01L 23/34* (2006.01)

(52) U.S. Cl.
USPC ........... 257/706; 257/675; 257/703; 257/712; 257/720; 257/773; 257/775; 257/E23.009; 257/E23.038; 257/E23.051; 257/E23.101; 257/E23.102; 257/E23.103; 257/E23.106; 257/E23.11

(58) Field of Classification Search
CPC ............. H01L 2224/0603; H01L 2224/82; H01L 2224/97; H01L 2224/24226; H01L 2224/4903; H01L 2224/92244; H01L 2224/06051; H01L 2224/49051; H01L 2924/01082; H01L 24/24; H01L 24/82; H01L 24/97; H01L 23/15; H01L 23/36; H01L 23/367; H01L 23/373; H01L 23/488; H01L 23/3735; H01L 23/49506; H01L 23/49822; H01L 23/49833; H01L 2225/06589; H01L 33/64
USPC .......... 257/E23.106, 706, 712, E23.051, 675, 257/703, E23.101, 720, 773, 775, E23.009, 257/E23.038, E23.11, E23.102, E23.103
See application file for complete search history.

(56) References Cited

U.S. PATENT DOCUMENTS

| | | | |
|---|---|---|---|
| 5,362,926 A | 11/1994 | Fukuda et al. | |
| 5,672,848 A | 9/1997 | Komorita et al. | |
| 6,207,221 B1 * | 3/2001 | Schulz-Harder | 430/312 |
| 6,232,657 B1 * | 5/2001 | Komorita et al. | 257/700 |
| 6,261,703 B1 | 7/2001 | Sasaki et al. | |
| 6,586,783 B2 * | 7/2003 | Boursat et al. | 257/207 |
| 6,938,333 B2 * | 9/2005 | Osanai et al. | 29/830 |
| 7,800,908 B2 * | 9/2010 | Schulz-Harder et al. | 361/708 |
| 2004/0099948 A1 * | 5/2004 | Stockmeier | 257/728 |
| 2005/0126758 A1 * | 6/2005 | Schulz-Harder | 165/104.21 |
| 2006/0258055 A1 | 11/2006 | Okamoto | |
| 2007/0007280 A1 * | 1/2007 | Bayerer | 219/604 |
| 2009/0166851 A1 * | 7/2009 | Kobayashi et al. | 257/706 |

* cited by examiner

FOREIGN PATENT DOCUMENTS

| | | |
|---|---|---|
| DE | 3922485 | 6/1990 |
| DE | 69730388 | 9/2005 |

*Primary Examiner* — Bac Au
(74) *Attorney, Agent, or Firm* — Welsh Flaxman & Gitler LLC

(57) ABSTRACT

An electric device with an insulating substrate consisting of an insulating layer and at least one metallization on a surface side of the insulating layer, the metallization being structured and having an electric component on the metallization. The metallization has a layer thickness that is stepped and is greater in an area adjoining the component.

15 Claims, 4 Drawing Sheets

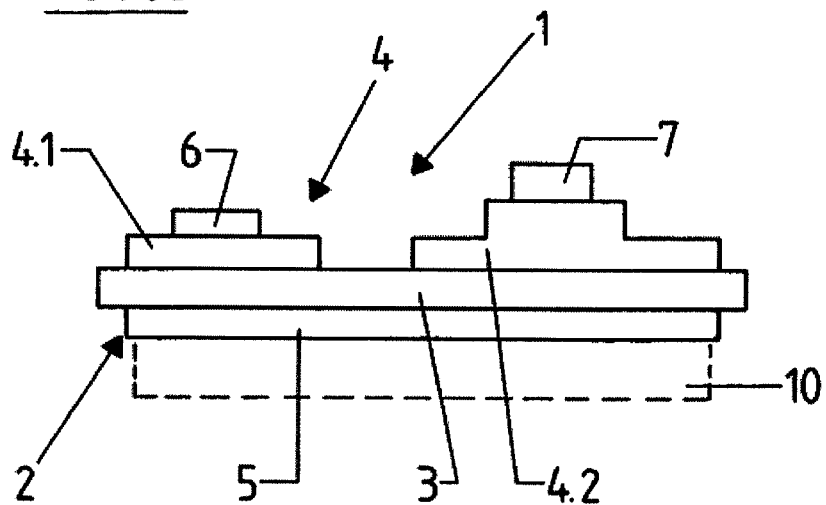
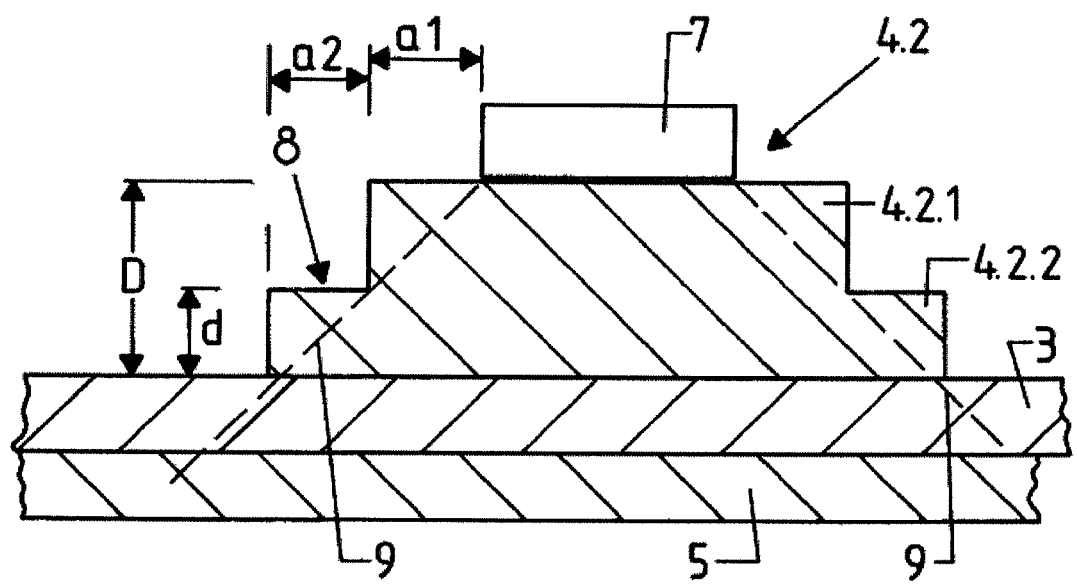

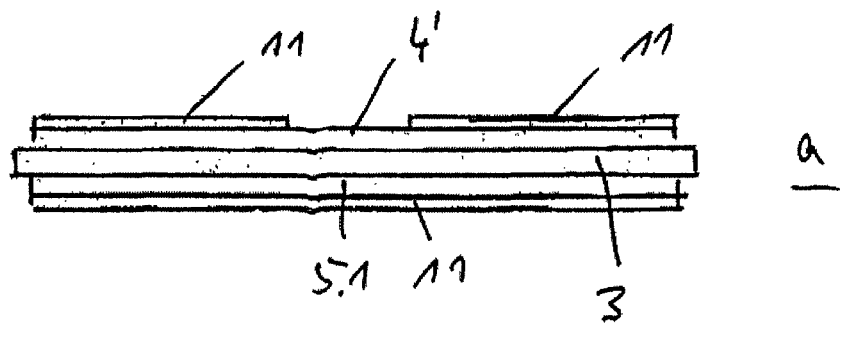
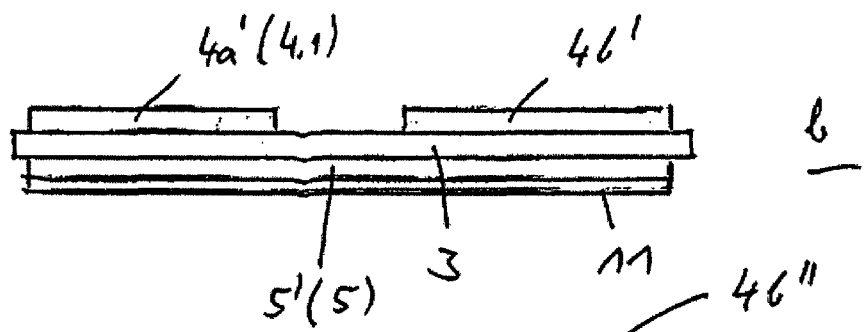
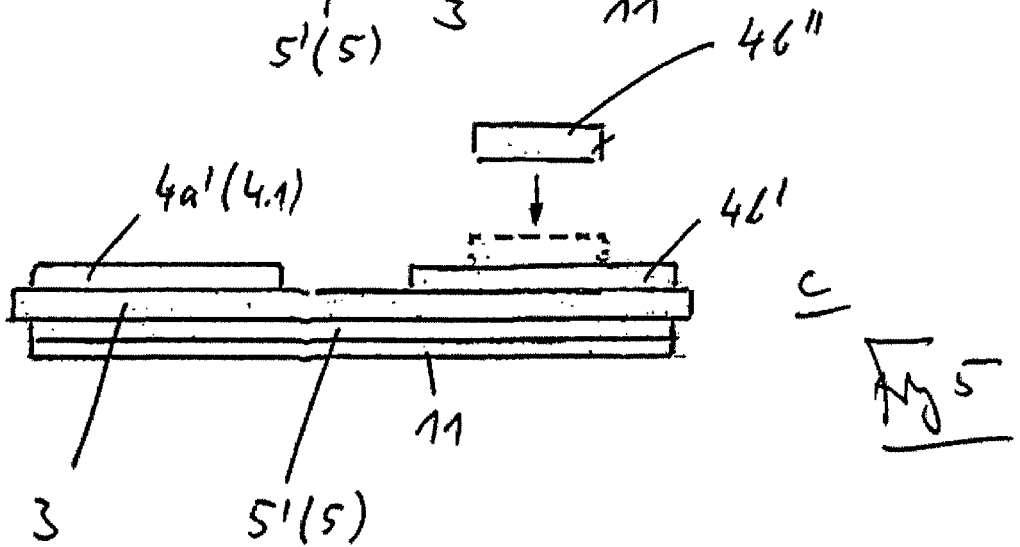
Fig 5

ELECTRONIC DEVICE

BACKGROUND OF THE INVENTION

The invention relates to electronic devices or electronic circuits and/or modules. The device has an insulating layer substrate with an insulating layer and at least one metallization of a surface side of the insulating layer. The at least one metallization has an electric component thereon generating a heat loss.

Electronic devices or circuits and modules of this type are known in the art in numerous embodiments.

Also known in the art is DCB (Direct Copper Bond) technology, which is used to bond metal layers or sheets (e.g. copper sheets or foils) with each other and/or with ceramic or ceramic layers, namely using metal or copper sheets or metal or copper foils, which are provided on their surfaces with a layer or coating (hot-melt layer) resulting from a chemical bond between the metal and a reactive gas, preferably oxygen. In this method, which is described, for example, in U.S. Pat. No. 3,744,120 and in DE-PS 23 19 854, this layer or coating (hot-melt layer) forms a eutectic with a melting temperature below the melting temperature of the metal (e.g. copper), so that the layers can be bonded to each other by placing the foil on the ceramic and heating all layers, namely by melting the metal or copper essentially only in the area of the hot-melt layer or oxide layer.

This DCB method comprises the following steps:
oxidation of a copper foil so as to produce an even copper oxide layer;
placing the copper foil on the ceramic layer;
heating the composite to a process temperature between approx. 1025 and 1083° C., e.g. to approx. 1071° C.;
cooling to room temperature.

Also known is the so-called active soldering method (DE 22 13 115; EP-A-153 618) for bonding metal layers or metal foils forming metallizations, in particular also of copper layers or copper foils, with ceramic material. In this process, which is used especially for manufacturing a metal-ceramic substrate, a bond is produced at a temperature of ca. 800-1000° C. between a metal foil, for example copper foil, and a ceramic substrate, for example aluminum-nitride ceramic, using a hard solder, which in addition to a main component such as copper, silver and/or gold also contains an active metal. This active metal, which is at least one element of the group Hf, Ti, Zr, Nb, Ce, creates a bond between the solder and the ceramic through a chemical reaction, while the bond between the solder and the metal is a metallic hard solder bond.

It is an object of the present invention is to present electronic devices that are optimized with respect to cooling of power components, i.e. of components that during operation generate a substantial power loss and therefore high heat.

SUMMARY OF THE INVENTION

The preferred embodiment according to the invention not only optimizes cooling of power components of electronic devices, circuits or modules, but also increases the reliability and service life of such devices, namely due to the fact that in the preferred embodiment of the invention at least one metallization area supporting the power component causes the metallization area to function as a heat spreader which optimizes the cooling effect, while at the same time the volume of the metal material on this metallization area is reduced to the extent that temperature changes that occur during operation of a device, for example during switching of loads, does not result in destruction of the substrate and/or of the components due to thermally related mechanical forces.

BRIEF DESCRIPTION OF THE DRAWINGS

The invention is described in more detail below based on exemplary embodiments, in which:

FIG. 1 shows a simplified representation in side view of an electronic device (circuit or module) according to the invention;

FIG. 2 shows an enlarged view of a part of the device of FIG. 1; and

FIG. 3-5 respectively show the process steps of different processes for manufacturing the metal-insulating layer substrate of the device in FIGS. 1 and 2.

DETAILED DESCRIPTION OF THE INVENTION

Figure 3:
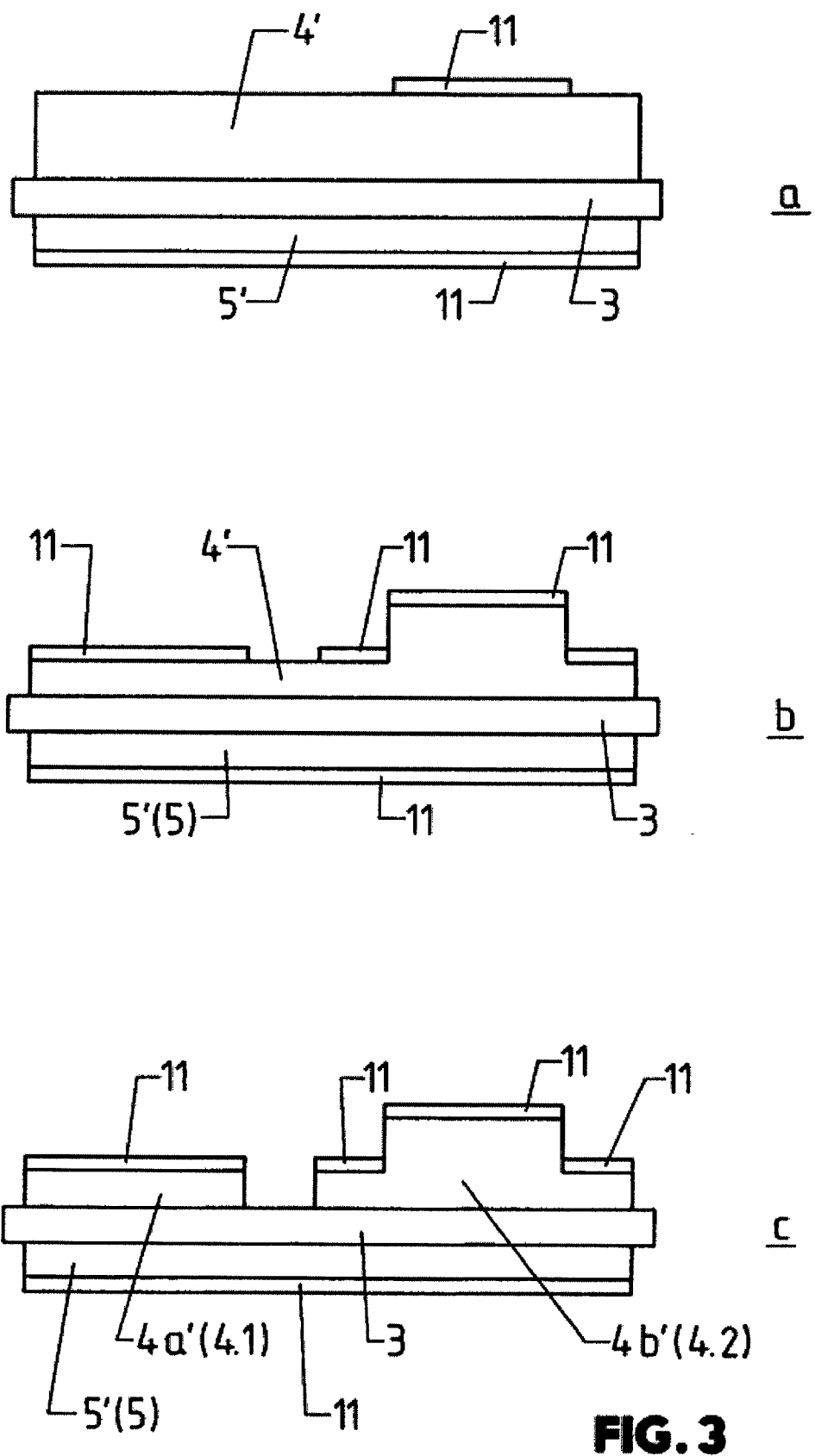

The electronic device generally designated 1 in the drawings consists in the depicted embodiment essentially of a metal-insulating layer substrate 2 with a preferably ceramic insulating layer 3, on the surface sides of which a metallization 4 and 5 is provided, respectively. For forming a printed circuit board or for forming contact surfaces and conductor strips the upper metallization 4 is structured, as indicated in FIG. 1 with the two metallization areas 4.1 and 4.2. The lower metallization 5 is designed to be continuous, i.e. it extends, with the exception of a free edge area, over the entire lower surface side of the insulating layer 3. Suitable ceramics for the insulating layer 3 consist for example of aluminum oxide ($Al_2O_3$), aluminum nitride (AlN), silicon nitride ($Si_3N_4$) and/or silicon carbide (sic) or of aluminum oxide and zirconium oxide ($Al_2O_3+ZrO_2$). The thickness of the insulating layer 3 is between approximately 0.15 mm and 1 mm.

Suitable materials for the metallizations 4 and 5, or for the metallization areas 4.1 and 4.2 of the metallization 4, are copper, copper alloys, aluminum or aluminum alloys. The metallizations 4 and 5, or the metallization areas 4.1 and 4.2, are connected with the insulating layer 3 by means of DCB bonding, active soldering and/or hard soldering, for example using a eutectic copper-silver solder or other suitable means, for example adhesive bonding.

Electronic components 6 and 7 are fastened to the metallization areas 4.1 and 4.2 by means of soldering, adhesive bonding, sintering or other suitable means, so that a thermal connection exists between the component 6 and the metallization area 4.1 and also between the component 7 and the metallization area 4.2. The component 7 is a power component, for example a power semiconductor component or chip (IC), e.g. a transistor, diode, triac thyristor, etc. with increased power dissipation and with increased cooling requirements, while the component 6 is a component with low power and therefore also with low power dissipation, for example a semiconductor circuit or chip (IC) for controlling the component 7.

A characteristic feature of the device 1 or of the metal-insulating substrate 2 is that the structured metallization 4 has an increased layer thickness D essentially only in a sub-area 4.2.1 below the respective power component 7, i.e. in the depicted embodiment below the component 7 and otherwise the layer thickness d of the metallization 4 and its metallization areas 4.1 and 4.2, also of the sub-area 4.2.2, is substantially reduced and is approximately equal to the layer thickness d of the lower metallization 5. The form of the metallization area 4.2 can therefore be described as consisting of the sub-area 4.2.1 with the layer thickness D and of the sub-area or edge area 4.2.2 with a reduced layer thickness d surrounding the first sub-area, the metallization area 4.2 being executed as one piece or monolithically with the sub-areas.

Due to the sub-area 4.2.1 with the layer thickness D and due to the sub-area 4.2.2 surrounding the sub-area 4.2.1, the metallization area 4.2 is step-shaped on its edge 8, namely so that the component 7 is at a distance a1 from the edge of the topmost step or from the edge of the sub-area 4.2.1 that is at least equal to or somewhat greater than the difference b between the layer thicknesses D and d, i.e a1>b.

Further, the width a2 of the step formed by the step-shaped edge 8 is at least equal to the layer thickness d.

This embodiment or form of the metallization area 4.2 ensures that it can function optimally as a heat spreader for optimal cooling of the component 7, as indicated in FIG. 2 by the dotted lines 9 that extend at an angle of less than 45° relative to the plane of the surface sides of the insulating layer 3 or of the metal-insulating substrate 2. Also due to this design, the metal volume of the metallization area 4.2 and therefore also the mechanical tensions between the metallization 4 or the metallization area 4.2 and the insulating layer 3 caused by temperature changes are adjusted to a value that will not have a negative effect on the life of the device 1.

Also relevant for the layer thicknesses d and D is that the layer thickness of the metallization 4 outside of the power component 7 is selected so that a sufficiently large cross section is achieved for the strip conductors produced by the structuring of the metallization 4 or for the expected currents, while the layer thickness D of the metallization 4 below the power component 7 is selected to be sufficiently large for optimal cooling and therefore for optimal heat spreading. For this purpose the layer thicknesses D and d are selected so that their difference b is equal to or greater than d/2. Of further relevance is the relationship that the sum of the distances a1 and a2 is at least equal to but preferably greater than the layer thickness D of the metallization area 4.2 below the component 7, i.e. a1+a2>D.

The layer thicknesses of the metallization 4 outside of the sub-area 4.2.1 and of the metallization 5 is on the order of 0.05 mm to 0.8 mm and the layer thickness D is then on the order of 0.1 mm to 1.6 mm.

To keep the metal volume of the metallization area 4.2 as small as possible, the square measure of the surface below the component 7 is approximately 5 mm$^2$ to 180 mm$^2$, preferably 9 mm$^2$ to 150 mm$^2$, which is sufficient for the layout of standard semiconductor components such as power transistors and diodes, especially for such semiconductor components which, as integrated semiconductor circuits consist of a control or switch element and a diode.

By means of the metallization 5, the device 1 is connected at least thermally with a cooler or a heat sink, as indicated in FIG. 1 by the dotted line. The cooler 10 is for example a passive cooler, which transfers the heat or heat loss to the environment, for example to the ambient air, via cooling surfaces, for example in the form of cooling fins, or an active cooler, which forms at least one cooling channel through which a coolant, for example a liquid coolant, can flow.

The connection between the metallization 5 and the cooler 10 is achieved by adhesive bonding, sintering, soldering or DCB bonding. In principle it is also possible, dispensing with the metallization 5, to provide the cooler 10 directly on the bottom side of the insulating layer 3 facing away from the metallization 4, namely likewise by DCB bonding, active soldering, adhesive bonding, etc.

The described embodiment of the metal-insulating substrate 2 offers the additional advantage that the reduced layer thickness of the metallization 4 outside of the sub-area 4.2.1 enables the fine structuring especially of the metallization area 4.1, for forming finely structured strip conductors, contact surfaces, etc. This also makes it possible to implement complex circuits comprising a plurality of components, especially active components, together with at least one power component, compactly, i.e. on a metal-insulating layer substrate 2 with small dimensions. The reduced layer thickness of the metallizations 4 and 5 and especially also the reduction of the metal volume of the metallization area 4.2 further prevents bending of the metal-insulating layer substrate due to the bi-metal effect when it becomes hot, at least to the extent that no damage to the components 6 and 7 occurs.

FIG. 3 shows in Positions a)-c) the steps of a manufacturing method for manufacturing the metal-insulating layer substrate 2. In this method first a metal layer in the form of a metal foil 4' (e.g. copper or aluminum foil) with the layer thickness D is applied to the top side of the insulating layer 3 and a metal layer in the form of a metal foil 5' (e.g. copper or aluminum foil) with the layer thickness d is applied to the bottom side of the insulating layer 3. The metal foil 4' is masked with a resist coating or photoresist or etch-resistant mask 11 where the metallization 4 of the finished substrate 2 is to have the layer thickness D (Position a)).

Afterwards, the metal foil 4' is etched away until it has the layer thickness d outside of the etch-resistant mask 11 corresponding Position b).

Then the entire surface of the remaining metal foil 4' is covered with the etch-resistant mask 11, namely with the exception of those areas on which the metallization 4 is not provided, i.e. with the exception of the intermediate spaces between the metallization areas 4.1 and 4.2, so that after repeated etching and removal of the etch-resistant mask 11, the structuring of the metallization 4 is achieved (Position c)).

The metal foil 5' with the layer thickness d forming the metallization 5 is protected during the entire structuring process by covering it with the etch-resistant mask 11 or in another suitable manner.

Figure 4:
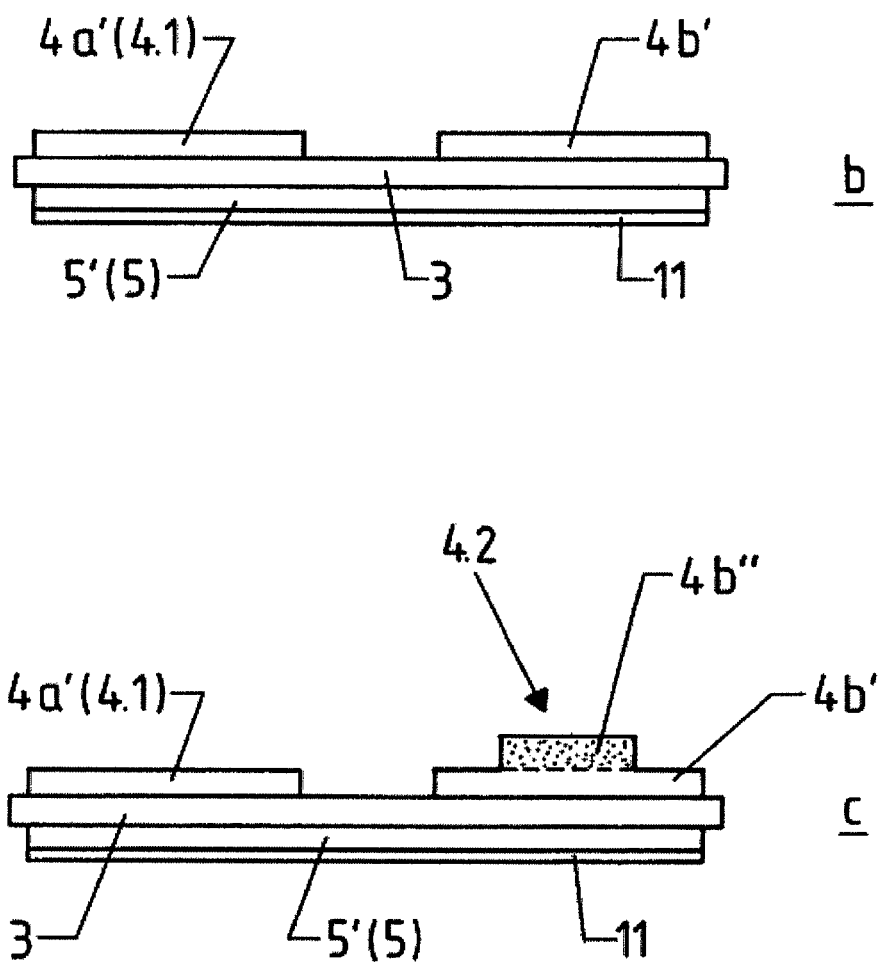

FIG. 4 shows in Positions a)-c) the steps of a manufacturing method in which metal layers in the form of metal foils 4' and 5' (e.g. copper or aluminum foil) with the layer thickness d are first applied to both surface sides of the insulating layer 3 (Position a)).

By applying an etch-resistant mask 11 and by subsequent etching, the metal foil 4' is structured to form the foil area 4a', which forms the metallization area 4.1, and in the foil area 4b'. An additional metal layer 4b'' is then applied on the foil area 4b' using a suitable method, for example by galvanic and/or chemical precipitation and/or by thermal spraying and/or in a plasma process, so that with the foil area 4b' and the additional metal layer 4b'' the form required for the metallization area 4.2 is achieved.

The metal of the additional metal layer 4b'' is the metal of the metal foil 4', e.g. copper, copper alloy, aluminum or aluminum alloy. In principle, a different material other than the material of the metal foil 4' can be used for the additional metal layer 4b''. Further, the additional metal layer 4b'' can be produced by laser sintering, using a metal sinter material as the sinter layer.

The metal foil 5' forming the metallization 5 is protected during the entire process, by covering it with a protective layer or in another manner.

FIG. 5 shows in Positions a)-c) the steps of a manufacturing method in which metal layers in the form of metal foils 4' and 5' (e.g. copper or aluminum foil) with the layer thickness d are first applied to both surface sides of the insulating layer 3. The metal foil 4 is then structured to form the foil areas 4a' and 4b', e.g. by masking and etching (Positions a) and b)).

The additional metal layer 4b" is applied to the foil area 4b' in the form of a metal platelet, which is bonded with the metal layer 4b' by DIRECT bonding or DCB bonding, by soldering, preferably by hard soldering so that together with the sub-area 4.2.1 it forms the foil area 4b'. The application of the metal platelet forming the metal layer 4b" is used if the metal-insulating layer substrate is manufactured together with a plurality of further substrates using a large-format ceramic multiple panel, is applied using a mask and/or the platelet forming the additional metal layer 4b" is part of a formed part manufactured by punching it from a metal foil, in which (formed part) the respective platelet is held by at least one rib, which then after bonding of the platelet with the metal layer 4b' is separated, mechanically or in another suitable manner, e.g. by means of a laser.

It was assumed above for the sake of clarity that the metallization 4 forms only two metallization areas 4.1 and 4.2. In the practical embodiment of the device 1 this metallization can have several metallization areas 4.1 with a reduced layer thickness and several metallization areas 4.2 for several power components 7. Further, it is possible that the electronic device or its metal-insulating layer substrate can have only one metallization area 4.2.

The invention was described above based on exemplary embodiments. It goes without saying that numerous modifications and variations are possible without abandoning the underlying inventive idea upon which the invention is based. It was assumed above that only the metallization 4 is structured. Of course, embodiments are possible in which the metallization 5 is also structured.

| Reference list | |
|---|---|
| 1 | electronic device or circuit |
| 2 | metal-insulating layer substrate |
| 3 | insulating layer |
| 4, 5 | metallization |
| 4.1, 4.2 | metallization area |
| 4' | metal layer or metal foil |
| 4b', 4b" | metal layer |
| 5 | metallization |
| 6, 7 | component |
| 8 | step |
| 9 | line |
| 10 | cooler |
| 11 | protective or etch-resistant layer |
| a | distance between component 7 and top edge of the metallization area 4.2 |
| a2 | width of the step 8 |
| d | layer thickness of the metallizations 4 and 5 outside of the sub-section 4.2.1 comprising the component 7 |
| D | layer thickness of the metallization 4 beneath the component 7 |
| b | difference between the layer thicknesses D and d |

The invention claimed is:

1. An electronic device,
comprising: a metal-insulating layer substrate comprising an insulating layer and a first metallization on a surface side of the insulating layer, the first metallization is structured for forming a plurality of metallization areas, and comprising at least one electric component generating heat loss and provided on a first metallization area of the first metallization,
wherein the first metallization has a first layer thickness (D) on a sub-area with which the electric component is at least thermally connected, the first layer thickness (D) is substantially greater than a second layer thickness (d) of the first metallization area outside of the first sub-area, wherein a difference (b) between the first layer thickness (D) and the second layer thickness (d) is at least equal to or greater than half the second layer thickness (d) of the first metallization area outside of the first sub-area and that a distance (a1) of the component from a margin of the first sub-area is equal to or greater than the difference (b) between the first layer thickness (D) and the second layer thickness (d).

2. The electronic device according to claim 1, wherein the first metallization area has a layer thickness that changes stepwise, the first sub-area with the first layer thickness (D) is enclosed at least partially by a sub-area with the second layer thickness (d).

3. The electronic device according to claim 1, wherein the first metallization comprises a second structured metallization area, the second structured metallization area has a layer thickness smaller than the first layer thickness (D) of the first sub-area and equal to the second layer thickness (d) of the first metallization area outside of the first sub-area.

4. The electronic device according to claim 1, wherein a second metallization is provided on a second surface side of the insulating layer facing away from the first metallization.

5. The electronic device according to claim 4, wherein the first or second metallization comprises copper, a copper alloy, aluminum or an aluminum alloy.

6. The electronic device according to claim 1, wherein the layer thickness of the first metallization outside of the first sub-area or a layer thickness of the second metallization is between 0.5 mm and 0.8 mm.

7. The electronic device according to claim 1, wherein a thickness of the insulating layer is between 0.15 mm and 1.0 mm.

8. The electronic device according to claim 1, wherein the insulating layer is a ceramic layer selected from $Al_2O_3$, AlN, $Si_3N_4$, SiC or $Al_2O_3+ZrO_2$.

9. The electronic device according to claim 1, wherein a surface area occupied by the component has a square measure of 5 $mm^2$-180 $mm^2$.

10. The electronic device according to claim 1, wherein the component generating heat loss is connected by a solder, sintered or adhesive bond with the first metallization area of the first metallization.

11. The electronic device according to claim 1, wherein the insulating layer is connected by a second metallization with a cooler by DCB bonding, soldering or active soldering.

12. The electronic device according to claim 1, wherein the metallization areas of the first metallization are produced by step etching.

13. The electronic device according to claim 1, wherein the layer thickness (D) of the first sub-area is achieved by applying an additional metal layer to a metal layer connected with the insulating layer by chemical or galvanic precipitation, by laser sintering or by applying a metal platelet.

14. The electronic device according to claim 1, wherein a second metallization area is structured for forming conductor strips or contact surfaces.

15. The electronic device according to claim 14, wherein a component with reduced heat loss is provided on the second structured metallization area.

* * * * *